(12) United States Patent
Tzoref-Brill et al.

(10) Patent No.: US 8,595,676 B2
(45) Date of Patent: Nov. 26, 2013

(54) BDD-BASED FUNCTIONAL MODELING

(75) Inventors: Rachel Tzoref-Brill, Haifa (IL); Itai Segall, Tel-Aviv (IL); Tatyana Veksler, Zichron Yaakov (IL)

(73) Assignee: International Business Machine Corporation, Armonk, NY (US)

( * ) Notice: Subject to any disclaimer, the term of this patent is extended or adjusted under 35 U.S.C. 154(b) by 232 days.

(21) Appl. No.: 13/163,700

(22) Filed: Jun. 19, 2011

(65) Prior Publication Data

US 2012/0324414 A1 Dec. 20, 2012

(51) Int. Cl.
*G06F 17/50* (2006.01)
(52) U.S. Cl.
USPC ............................. 716/136; 716/106
(58) Field of Classification Search
USPC .................. 716/100–108, 136–138
See application file for complete search history.

(56) References Cited

U.S. PATENT DOCUMENTS

2008/0092098 A1* 4/2008 Jacobi et al. .................... 716/5

* cited by examiner

*Primary Examiner* — Paul Dinh
(74) *Attorney, Agent, or Firm* — Ziv Glazberg

(57) ABSTRACT

A computer-implemented method, apparatus, and computer program product for assisting in dynamic verification of a System Under Test (SUT). The method comprising obtaining a set of functional attributes and associated domains with respect to a System Under Test (SUT), and obtaining a set of restrictions over the functional attributes and associated domains. The method comprising encoding a Binary Decision Diagram (BDD) to represent a Cartesian cross-product test-space of all possible combinations of values of the functional attributes excluding combinations that are restricted by the set of restrictions, whereby the BDD symbolically represents the Cartesian cross-product test-space. The method may further comprise analyzing the Cartesian cross-product test-space by manipulating the BDD so as to assist in performing dynamic verification of the SUT.

24 Claims, 4 Drawing Sheets

BDD-BASED FUNCTIONAL MODELING

TECHNICAL FIELD

The present disclosure relates to functional modeling utilizing in dynamic verification in general, and to symbolic representation of the functional test-space using Binary Decision Diagram (BDD), in particular.

BACKGROUND

Computerized devices control almost every aspect of our life—from writing documents to controlling traffic lights. However, computerized devices are bug-prone, and thus require a testing phase in which the bugs should be discovered. The testing phase is considered one of the most difficult tasks in designing a computerized device. The cost of not discovering a bug may be enormous, as the consequences of the bug may be disastrous. For example, a bug may cause the injury of a person relying on the designated behavior of the computerized device. Additionally, a bug in hardware or firmware may be expensive to fix, as patching it requires call-back of the computerized device. Hence, many developers of computerized devices invest a substantial portion of the development cycle to discover erroneous behaviors of the computerized device.

During the testing phase, a sample of all possible behaviors of the computerized device, also referred to as a System Under Test (SUT), is inspected. Dynamic verification which stimulates the SUT and is used to identify bugs may be utilized. Generally, Dynamic verification is associated with the execution of the SUT (or simulation thereof), and dynamically checks its behavior. As opposed to static verification measures which analyze the SUT without executing it, such as model checking, formal verification, static code analysis, or the like. Dynamic verification may any of the following: test planning, test-generation, SUT simulation, testing of the SUT, coverage analysis, or the like.

Coverage tools for checking software provide a measure of how well the software being evaluated has been exercised during testing and thereby give a level of assurance that the software is of high quality.

There are a number of types of coverage known in the art, such as statement coverage, line coverage, condition coverage, path coverage, method coverage, and the like. One additional coverage method is functional coverage. Functional coverage is designed to measure amount, portion or a similar metric of tests that examined predetermined functional behaviors. Once functional coverage is measured, quality assurance (QA) personnel may design additional tests to examine untested behaviors.

A functional coverage is measured with respect to a functional coverage model. The functional coverage model defines a triplet: functional attributes, a domain for each functional attribute, and a set of restrictions. The functional attributes may be any attribute of the SUT, such as for example a type of web browser being used, an underlying Operating System, a number of threads operating, whether the output was printed. The domains may define for each attribute a set of possible values. For example, the web browser may be Microsoft® Internet Explorer®, Google® Chrome®, or Mozilla Firefox™. Similarly, the operating system may be Microsoft® Windows®, or Linux™. The cross-product of the different combinations of the attributes defines a functional coverage test-space. The test-space comprises a set of coverage tasks, each representing functional requirements to be tested: one requirement per functional attribute, and the requirement is that the functional attribute will exhibit the behavior of the value of the coverage task. The coverage task may be seen as a tuple of one value per attribute. In a functional coverage model in which there are three functional attributes, one having three possible values, the second having two possible values, and the third having ten possible values, the cross-product test-space comprises sixty (60) coverage tasks.

The functional coverage model may further comprise a set of restrictions defining a series of values of different attributes that may not appear together. For example, consider a functional coverage defining two attributes: ACTION and USER. The ACTION attribute may be each of the following values: RETRIEVE, STORE, and MODIFY PERMISSION. The USER attribute may be each of the following values: ADMIN, USER, GUEST. In some cases, a guest user cannot modify permission. A restriction may be defined to indicate that the couple (GUEST, MODIFY PERMISSION) is not a valid couple. The fact that a trace does not comprise an entry covering a coverage task that includes the couple does not affect the functional coverage. In other words, all possible coverage tasks—which together form the maximal possible coverage with respect to a functional coverage—do not include any coverage task that comprises the restricted couple. It will be understood that restrictions may be defined with respect to a combination of values of different attributes, and not necessarily with respect to a complete tuple of values. Furthermore, the restriction may be any constraint on combination of values, which may be represented using a Boolean formula over the functional attributes and associated values.

BRIEF SUMMARY

One exemplary embodiment of the disclosed subject matter is a computer-implemented method, the method performed by a processor, the method comprising: obtaining a set of functional attributes and associated domains with respect to a System Under Test (SUT); obtaining a set of restrictions over the functional attributes and associated domains; encoding a Binary Decision Diagram (BDD) to represent a Cartesian cross-product test-space of all possible combinations of values of the functional attributes excluding combinations that are restricted by the set of restrictions, whereby the BDD symbolically represents the Cartesian cross-product test-space; and analyzing the Cartesian cross-product test-space by manipulating the BDD so as to assist in performing dynamic verification of the SUT.

Another exemplary embodiment of the disclosed subject matter is a computerized apparatus having a processor, the apparatus comprising: a functional attributes obtainer adapted to obtain a set of functional attributes and associated domains with respect to a System Under Test (SUT); a restrictions obtainer adapted to obtain a set of restrictions over the functional attributes and associated domains; a Binary Decision Diagram (BDD) encoder adapted to encoding a BDD to represent a Cartesian cross-product test-space of all possible combinations of values of the functional attributes excluding combinations that are restricted by the set of restrictions, the BDD symbolically represents the Cartesian cross-product test-space; and a Cartesian cross-product test-space analyzer configured to analyze the Cartesian cross-product test-space by manipulating the BDD so as to assist in performing dynamic verification of the SUT.

Yet another exemplary embodiment of the disclosed subject matter is a computer program product comprising: a non-transitory computer readable medium; a first program instruction for obtaining a set of functional attributes and associated domains with respect to a System Under Test (SUT); a second program instruction for obtaining a set of restrictions over the functional attributes and associated domains; a third program instruction for encoding a Binary Decision Diagram (BDD) to represent a Cartesian cross-product test-space of all possible combinations of values of the functional attributes excluding combinations that are restricted by the set of restrictions, whereby the BDD symbolically represents the Cartesian cross-product test-space; and wherein the first, second and third program instructions are stored on the non-transitory computer readable medium.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
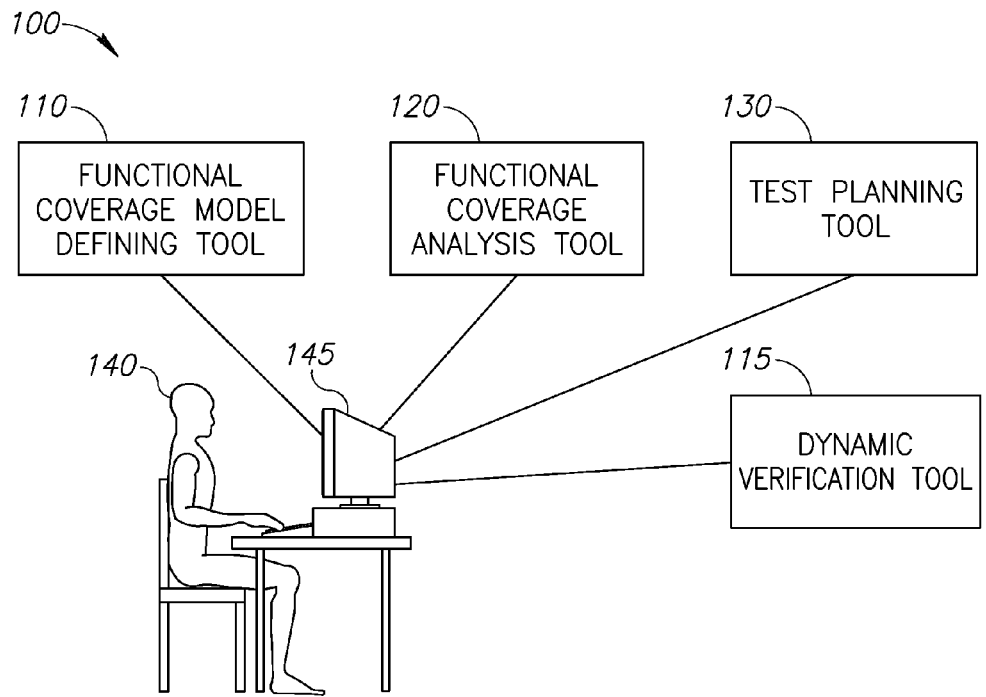
FIG. 1 shows a schematic illustration of a computerized environment, in accordance with some embodiments of the disclosed subject matter.

The disclosed subject matter is described below with reference to flowchart illustrations and/or block diagrams of methods, apparatus (systems) and computer program products according to embodiments of the subject matter. It will be understood that some blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to represent the functional coverage test-space, which potentially contains a substantially large number of potential coverage tasks, such as $2^{20}$, $2^{30}$ and the like.

Another technical problem is to assist a user in defining the functional coverage test-space and to plan testing of the functional coverage test-space.

One technical solution is to utilize a Binary Decision Diagram (BDD) to symbolically represent the functional coverage test-space. Symbolic representation is much more scalable than an explicit representation of the test-space, and may be useful in representing large sets of data.

Another technical solution is to encode multi-valued domains of functional attributes using n bits, and thus enable utilization of BDDs which are applicable on binary variables.

Yet another technical solution is to analyze the functional coverage test-space by manipulating the BDD. A user defining the model may utilize filtering and projections of the test-space to determine whether the definition is correct and/or sufficient. Filtering and projections may be determined by BDD manipulations.

Yet another technical solution is to perform test planning based on the BDD representation of the functional coverage test-space. In some exemplary embodiments, test planning may be performed by utilizing Combinatorial Test Design (CTD). CTD may be performed with respect to an interaction requirement, such as a pair-wise interaction or n-tuple interaction. The test plan may provide for sufficient coverage tasks that would assure that the interaction requirement is fulfilled. In some exemplary embodiments, the CTD may be performed by manipulating a plurality of BDDs, each associated with a different tuple of functional attributes, as is further explained hereinbelow. In some exemplary embodiments, CTD may be performed with respect to a set of a interaction requirements.

Yet another technical solution is to enforce a static ordering of the BDD variables. The order of the BDD variables may have a substantial effect on the size of the BDD data structure. Thus ordering the BDD variables in "good" ordering may be useful in decreasing its size.

One technical effect of utilizing the disclosed subject matter is providing for a scalable method to represent and utilize functional coverage test-spaces. It will be noted that specifically in the software domain, the cross-product test-space may be enormous due to the large number of attributes and/or the sizes of their respective domains. However, additional domains, such as for example the hardware domain, may also comprise a large number of attributes and/or large sized respective domains.

Another technical effect is to increase the capacity of methods that manipulated the functional coverage test-space, both in terms of the size of the models and in terms of the size of the requested interaction levels.

Yet another technical effect is that the disclosed subject matter enables to easily support any restriction that can be represented using a Boolean predicate. Therefore, any types of restrictions on the value combinations may be supported.

Omissions are a major risk in testing. Test planning techniques are a way to reduce omissions and increase the quality of testing. These techniques try to prevent omissions in advance (i.e., before tests are implemented and executed) by selecting what to test out of a possibly enormous test space. In some exemplary embodiments, the test planning is performed in a way that reduces as much as possible the risk of bugs escaping the verification process.

In some exemplary embodiments, test planning is based on a modeling of the test space using a functional coverage model. The test space can represent inputs, scenarios, configurations, the application's internal state, or any other aspect that we are interested in testing. The functional coverage model may comprise a set of functional attributes, a respective domain of possible values for each functional attribute, and restrictions on the value combinations. The restrictions may be viewed as Boolean expressions defining when value combinations are valid or invalid. For example, in case of a functional model which comprises the functional attributes of Web browser and Operating System, there may be a restriction such as: Operating System=Linux^Web browser=Internet Explorer. As another example, the restriction may be: Operating System≠Windows^Web browser=Internet Explorer. Alternatively, a restriction may define that legal combinations are: Operating System=Windows^Web browser=Internet Explorer. It will be understand that the above are provided as examples only and the restrictions may apply to other functional attributes, a different number thereof, using different logical operations and operators or the like. It will be further noted that, as in these examples, the restriction need not refer to all functional attributes, and may apply only to those functional attributes which are inter-connected.

The set of valid value combinations may define the functional coverage test-space. The functional coverage test-space is either the plurality of valid coverage tasks that may be covered by tests. A coverage task may be a functional characterization of an exhibited behavior and/or properties of a test of the SUT. It will be understood that a plurality of different tests may cover the same coverage task. Moreover, the same test may cover a plurality of coverage tasks. In some exemplary embodiments, the functional coverage test-space is defined by the functional coverage model as the Cartesian cross-product of the different values of the functional attributes excluding the coverage tasks which are deemed illegal. Alternatively, the functional coverage test-space may include all coverage tasks which are deemed legal. Other manners in which the functional coverage model may define the functional coverage test-space may be used instead.

With respect to test planning, a planning test-space may define potential tests that may be executed on the SUT. A test can be associated with exactly one potential test, as opposed to coverage tasks. In some exemplary embodiments, several different tests may hold the same potential test. The disclosed subject matter is applicable to Cartesian product models which are used as functional coverage test-spaces, planning test-spaces, or as both. In the present disclosure "Cartesian cross-product test-space" is a functional test-space associated with the SUT that may be defined by a cross-product of values of functional attributes, and having some combinations thereof excluded therefrom. It will be therefore understood that a functional coverage test-space is a Cartesian cross-product test-space. Similarly, a planning test-space is a Cartesian cross-product test-space. In some exemplary embodiments, the planning test-space may be used also as a functional coverage test space. In some exemplary embodiments, the functional coverage test-space may be modified and adapted to be a planning test-space, such as for example, as disclosed in U.S. Patent Publication 2010/0275062 for Ur, entitled "FUNCTIONAL COVERAGE USING COMBINATORIAL TEST DESIGN", which is hereby incorporated by reference. For simplicity, the disclosure refers to Cartesian cross-product test-space as comprising coverage tasks.

One possible method of test planning is Combinatorial Test Design (CTD), also referred to as n-wise testing. CTD is designed to select a subset of the test space so as to cover all possible combinations of every two (or three, four, etc.) functional attributes. The required coverage of the selected subset is referred to as "interaction level", i.e., interaction level 2 may mean that for every two functional attributes, all valid value combinations must appear in the selected subset of the test space. In some exemplary embodiments, the interaction level may be associated with a subset of the functional attributes. Moreover, in some cases, different interaction levels may be associated with different subset of attributes. It will be noted that the disclosed subject matter is described with respect to a CTD model that requires one requirement: an interaction level with respect to all functional attributes. However, a person of ordinary skill in the art may expand it to handle a CTD model with a plurality of requirements.

In some exemplary embodiments, the motivation for the approach of CTD is that most bugs depend on the interaction between a small number of functional attributes.

Functional coverage models may not scale well. In case the value combinations of the model are represented explicitly, the model may become very large. Consider a model with 30 variables and 3 values per variable. This defines a model with 3^30 combinations, which requires a large memory capacity. Practically, this model may be too large to be explicitly represented in memory. In addition to representing the model, there are operations that are used during the development of the model, such as viewing projections of the model and extracting various views that help in making sure that the model is consistent and complete. Such operations, when performed with respect to explicit representation and enumeration of the test-space, may encounter the same scalability issue.

CTD algorithms may also deal with the scalability issues. They may assume that the combinations space is too large to be represented explicitly, and use various techniques to try to generate an optimized test plan without explicitly enumerating all possible combinations. Examples of such algorithms may be a reduction to the orthogonal arrays or covering arrays problems. Those techniques are limited in the type of restrictions they allow on the value combinations, or in the type of requested interaction level, and still hit scalability issues as the number of model variables increases.

The scalability problem may limit the use of test planning in real-life applications.

Thus there is a need to provide for a mechanism to represent efficiently large Cartesian cross-product test-spaces and enable performing operations thereof, in a more scalable manner.

In some exemplary embodiments, a symbolic representation of the functional coverage model may be utilized. The symbolic representation may use a BDD. A BDD is a relatively compact data structure for representing and manipulating Boolean functions. By representing a Boolean function that is associated with whether or not the combination of functional attributes is a member of the functional coverage test-space, the BDD may be utilized to represent the Cartesian cross-product test-space. Thus, the Boolean function is seen as answering the question: is this a valid coverage task in accordance with the functional coverage model?

Instead of representing the set of valid combinations explicitly, a BDD may be built using the restrictions, as is further disclosed hereinbelow. The BDD evaluates to "true" exactly the set of assignments that represent valid value combinations. In this way the size of the Cartesian cross-product test-space is likely to be significantly reduced, since the worst case is the explicit representation as a truth table representation, and BDDs are usually much smaller than the worst case. Since the size of the BDD highly depends on the variable order, a static order of variables may be determined so as to further reduce the size of the BDD. For example, the order can be determined according to the number of appearances of each variable in the restrictions.

Referring now to FIG. 1, showing a schematic illustration of a computerized environment, in accordance with some embodiments of the disclosed subject matter. A computerized environment 100 may comprise one or more computerized tools.

In some exemplary embodiments, a user 140, such as a developer, a QA staff member, a tester, a designer, a verification engineer or the like, may interact with the computerized environment 100. The user 140 may utilize a Man-Machine Interface (MMI) 145 such as a terminal, a display, a keyboard, an input device or the like.

In some exemplary embodiments, a functional coverage model defining tool 110 may be utilized to define the functional coverage model. In some exemplary embodiments, the user 140 may define the functional attributes, domains and restrictions. In some exemplary embodiments, defining the functional coverage model may be an iterative process in which the user 140 may examine the functional coverage test-space and add or remove restrictions, then examine the test-space again, and so forth. In some exemplary embodiments, a similar tool may be utilized to define a planning test-space. In some exemplary embodiments, the functional coverage model may be adapted to be utilized as a planning test model.

In some exemplary embodiments, a dynamic verification tool 115 may be utilized to test the SUT. It will be noted that the SUT may be hardware, firmware, software, combination thereof or any other type of computerized device. The dynamic verification tool 115 may be a simulation-based verification tool, a test-generation platform, or the like. The dynamic verification tool 115 may be operatively coupled to a test planning tool 130 and configured to perform testing in accordance with the test plan. In some exemplary embodiments, the test planning tool 130 may provide the tests for the dynamic verification tool 115 to perform. It will be noted that dynamic verification is a broader concept than testing the SUT, and it further includes test planning, coverage analysis and the like. The dynamic verification tool 115 provides only one aspect of the entire scope of operations that may be performed during dynamic verification, and should not be used to construe the term "dynamic verification" narrowly.

In some exemplary embodiments, a functional coverage analysis tool 120 may be configured to measure functional coverage based on the dynamic verification performed by the dynamic verification tool 115. The functional coverage analysis tool 120 may provide a coverage measurement, such as a portion of the coverage test-space or of the defined test plan, indicative of coverage tasks that were covered during dynamic verification performed by the dynamic verification tool 115. The user 140 may review the coverage measurement and/or the list of covered tasks.

In some exemplary embodiments, a test planning tool 130 may define a test is plan to be covered. In some exemplary embodiments, the test plan may be a set of coverage tasks to be covered, thereby providing a subset of the Cartesian cross-product test space to be tested instead of the entire test-space. In some exemplary embodiments, the test plan tool 130 may provide tests that are likely to cover the test plan, such as based on a test benchmark stored in a datastore (not shown) which comprises tests that are known/estimated to cover specific functional aspects. As another example, the test plan tool 130 may be configured to generate tests so as to cover coverage tasks. The user 140 may review the test plan, the selected test or the like. In some exemplary embodiments, the user 140 may provide parameters for the test planning tool 130 to use in determining the test plan, such as a desired interaction level.

Figure 2:
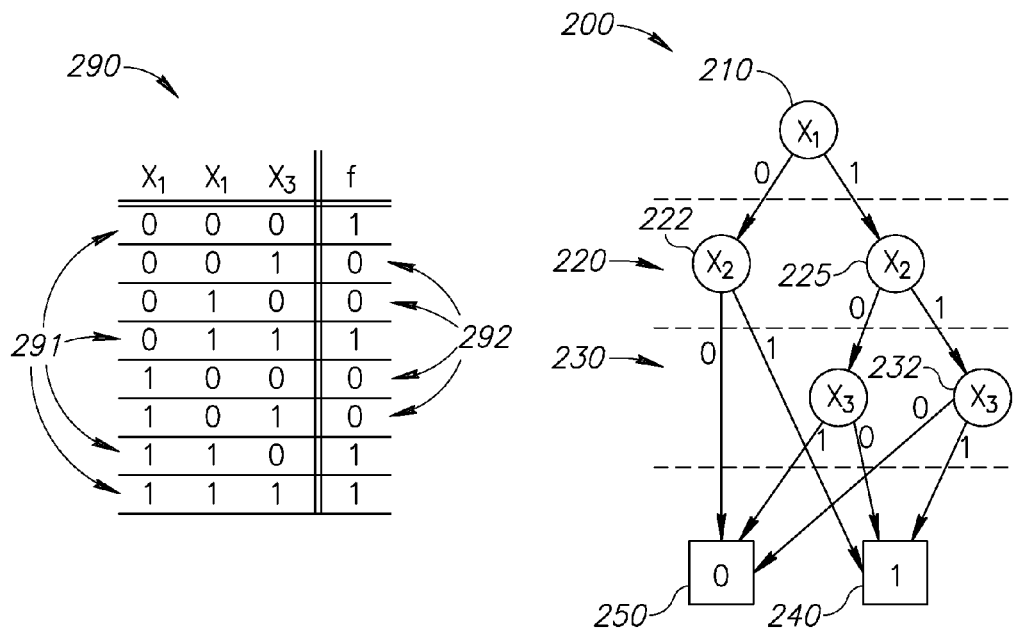
FIG. 2 shows an illustration of a Binary Decision Diagram (BDD), in accordance with some exemplary embodiments of the disclosed subject matter.

Referring now to FIG. 2 showing an illustration of a Binary Decision Diagram (BDD), in accordance with some exemplary embodiments of the disclosed subject matter. A BDD 200 for the binary function $(x_1 \land x_2) \lor (x_2 \land x_3) \lor (\neg x_1 \land \neg x_2 \land \neg x_3)$ is a compact data structure that provides for an assignment to the binary variables $x_1, x_2, x_3$ whether the binary function is evaluated to true (1) or false (0). As can be appreciated the BDD variables are binary variables. However, functional attributes may that are not binary may be encoded using two or more BDD variables. For example, the variables $x_1, x_3$ may be associated with a single functional attribute having a domain of three or four alternative values.

In some exemplary embodiments The BDD 200 is a Directed Acyclic Graph (DAG), which consists of decision nodes and two terminal nodes 240, 250. Each decision node is labeled by a BDD variable and has two child nodes. The edge from a node to a child node represents an assignment of the variable to 0 or 1. The BDD 200 is ordered as different variables appear in the same order on all paths from the root. In some exemplary embodiments, the BDD may merge isomorphic sub-graphs and may exclude nodes whose children are isomorphic. Thus, the BDD is a compact version of a Binary Decision Tree from the same function.

A path from the root node 210 to the 1-terminal 240 represents a (possibly partial) variable assignment for which the represented Boolean function is true. As the path descends to a child from a node, then that node's variable is assigned a corresponding value.

BDD 200 orders the BDD variables. the root node, node 210, is associated with $x_1$, based on its value a sub-graph beginning in the second level 220 is selected (either node 222 or node 225). The second level 220 is associated with $x_2$. Based on its value a sub-graph beginning in the third level 230 is selected. The third level 230 is associated with $X_3$.

If at any time, the value of the function is constant and no addition information is needed, the BDD skips the next levels to the relevant constant value: one (terminal node 240) or zero (terminal node 250). For example, if $x_1$ is true (1) and $x_2$ is false (0), then no matter what the value of $x_3$ is, the function is evaluated to zero.

The order of the BDD variables may affect its size. Generally speaking the variables which are most useful to determine the constant value should be placed in high levels of the BDD (near the root) so as to allow the evaluation to be performed with as few edges as possible.

Referring to a truth table 290 of the same function of the BDD 200, rows 291 are rows for which the function is evaluated to true (1) and rows 292 are rows for which the function is evaluated to false (2). The BDD 200 provides the same information as the truth table 290 using a symbolic representation.

It will be noted that the BDD 200 may be used directly to perform calculations. For example, universal quantification of a variable may be performed, as well as existential quantification. Furthermore, Boolean operations, such as conjunction and disjunction, between functions may be performed directly using their BDDs.

It will be further noted that in the present disclosure and in the claims, the term Binary Decision Diagrams (BDDs) may refer to BDDs and variations thereof, such as for example Zero-suppressed Decision Diagrams (ZDDs), Multi-Terminal Decisiona Diagrams (MTDDs), Multi-Valued Decision Diagram (MDDs), and Binary Moment Diagrams (BMDs).

Generally, ZDDs are a version of BDDs where instead of introducing a node in the diagram when the result of the function is different between the 'true' and 'false' assignments to the corresponding variable, a node is introduced when the 'false' assignment to the corresponding variable results in evaluating the function to anything different than the constant 'false'. ZDDs are disclosed in A. Mishchenko, "An Introduction to Zero-Suppressed Binary Decision Diagrams", Proceedings of the 12th Symposium on the Integration of Symbolic Computation and Mechanized Reasoning, 2001, which is hereby incorporated by reference.

Generally, MTDDs are an extension of BDDs where the function can evaluate to more than two values, i.e., have multiple terminal nodes. MTDDs are disclosed in M. Fujita et al., "Multi-Terminal Binary Decision Diagrams: An Efficient Data Structure for Matrix Representation", Formal Methods in System Design—FMSD, vol. 10, no. 2/3, pp. 149-169, 1997, which is hereby incorporated by reference.

Generally, MDDs are a generalization of BDDs where the domains of the variables can be multi-valued. MDDs are disclosed in R. Brayton et al., "Multi-Valued Decision Diagrams Theory and Applications", Multiple-Valued Logic, 4 (1-2):9-62, 1998, which is hereby incorporated by reference.

Generally, BMDs are a generalization of BDDs to include also domains over integers and real numbers. BMDs are disclosed in R. E. Bryant et al., "Verification of Arithmetic Circuits with Binary Moment Diagrams", Proceedings of the 32nd ACM/IEEE design automation conference, 535-541, 1995, which is hereby incorporated by reference.

Figure 3A:
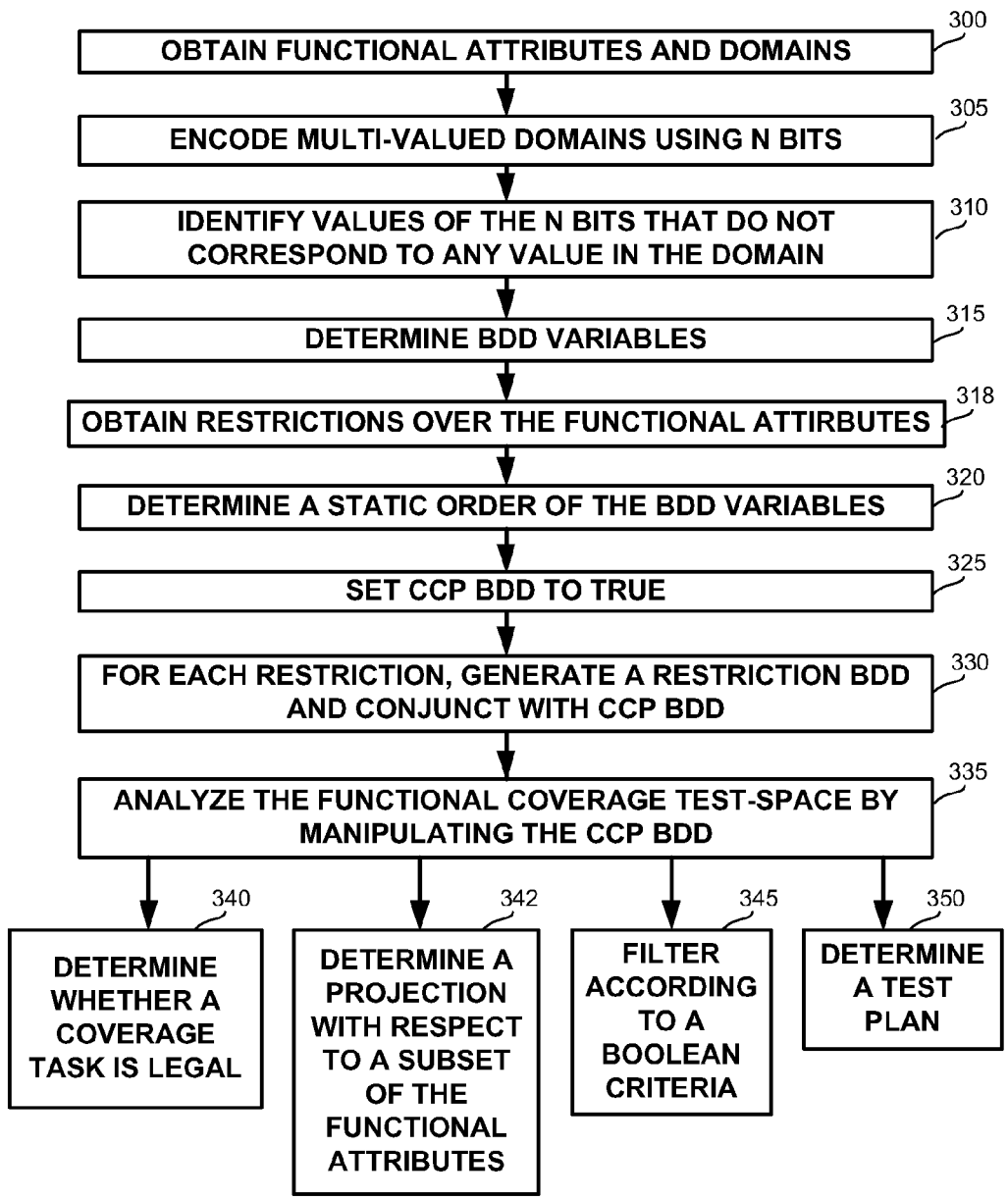
FIG. 3A shows a flowchart of a method of representing the Cartesian cross-product test-space using a BDD and utilization thereof, in accordance with some exemplary embodiments of the disclosed subject matter.

Referring now to FIG. 3A showing a flowchart of a method of representing the Cartesian cross-product test-space using a BDD and utilization thereof, in accordance with some exemplary embodiments of the disclosed subject matter.

In step 300, functional attributes and respective domains may be obtained. In some exemplary embodiments, the domain may be any finite domain comprising a finite number of alternative values. The functional attributes may be obtained from the user 140. The user 140 may define for each attribute a domain, either from predetermined domains, user-defined custom domains, or the like.

In step 305, multi-valued domains may be encoded using a number (n) of bits. The n bits may be encoded to n BDD variables such that the non-binary functional attribute is encoded using binary variables and therefore can be manipulated using BDDs. Each value of the domain may be encoded to different binary value using the n bits. In some exemplary embodiments, a multi-valued decision tree may be used to translate the n bits to the corresponding value of the domain. Other mapping methods is may be used, such as for example, a dictionary data structure. Additionally or alternatively, an MDD may be used to represent the model instead of other variations of the BDD data structure.

In step 310, values of the n bits that do not correspond to any value in the domain may be identified. Bookkeeping may be performed when performing operations on the BDDs, such as the BDD 200, so as to make sure that the value of the BDD is not affected by the value of BDD for those n-bit values. For example, after determining the set of legal tasks (e.g., after step 330), the BDD may be limited only to valid domains (i.e., an assignment that does not encode to valid functional attribute would result in a false (0) value of the BDD). Additionally or alternatively, the limitation to valid domains may be performed in other steps, such as after step 325. In some exemplary embodiments, the limitation may be performed by conjuncting with a BDD representing only valid domains values (i.e., the BDD returns true only for assignments to the BDD variables which are validly encoded to domains). In some exemplary embodiments, limiting BDDs to valid domains may be performed in additional occasions, such as when negating a BDD representing legal tasks in order to determine the set of illegal tasks. As assignment to a valid domain is a constraint that all tasks must adhere to, both the legal tasks and illegal tasks adhere to this constraint. By negating the set of legal tasks, the result would include the illegal tasks and the assignments which are invalidly encoded. The assignments which are invalidly encoded may be excluded, such as for example by conjuncting with the BDD representing only valid domain values.

In step 315, BDD variables may be determined A BDD variable may be allocated for each functional attribute with a binary domain. Functional attributes with multi-valued domains, may be associated with n BDD variables, corresponding to the n bits of step 305. In some exemplary embodiments, a functional attribute with a domain of two values may be translated into a binary domain of either 1 or 0, where one value is translated to 1 and the other to 0.

In step 318, one or more restrictions on the values of the functional attributes may be obtained. The user 140 may provide the restrictions. In some exemplary embodiments, the restrictions may be provided as a Boolean formula over the value of one or more functional attributes.

In step 320, a static order of the BDD variables may be determined. In some exemplary embodiments, the static ordering may be based on the number of times each functional attribute appears in restrictions. In some exemplary embodiments, BDD variables associated with the functional attribute that appears most in the restrictions may be ordered closely to the root. Alternatively, such BDD variables may be ordered close to the terminal nodes. In some exemplary embodiments, several BDD variables associated to the same functional attribute may be order so as to be proximate to one another. Additionally or alternatively, the static order may be based on an ordering of the functional attributes provided by the user 140.

In some exemplary embodiments, a dynamic reordering algorithm may be applied to modify the ordering of the BDD variables. The reordering may be performed heuristically, such as for example in response to the BDD reaching a threshold size. Additionally or alternatively, the static ordering may remain constant and unmodified throughout the processing of the method of FIG. 3A.

In step 325 a BDD of the Cartesian Cross-Product test-space (CCP BDD) is initialized to true (1). Thereby, symbolically representing a test-space of the Cartesian product of the functional attributes.

In step 330, for each restriction, a BDD for the Boolean formula of the restriction is constructed and conjuncted with the CCP BDD. The BDD of the restriction is referred to as a restriction BDD. The restriction BDD is evaluated to false if and only if the restriction applies (i.e., the assignment of values to the functional attributes is illegal under the restriction). The restriction BDD may be determined directly based on the restriction or based on some intermediate representation thereof, such as a disjunctive normal form (DNF) of the restriction. The CCP BDD is conjuncted with the restriction BDD, thereby constraining the test-space represented by the CCP BDD so as to exclude coverage tasks that are illegal under the restriction. After all restriction BDDs are conjuncted with the CCP BDD, the CCP BDD symbolically represents the Cartesian cross-product test-space.

In step 335, the Cartesian cross-product test-space may be analyzed by manipulating the CCP BDD. Different analysis and manipulations may be performed, such as those of steps 340, 342, 345, and 350.

In some exemplary embodiments, analysis may be performed during the development of the model. Developing a functional model may be a manual effort, and is may be performed incrementally until reaching a model that captures the test space in a consistent and complete way. Different analyses that help the user in developing the is model include for example observing a projection of the model on a subset of the variables and whether for a specific assignment to the subset all combination of values to the complementary variables are valid, are invalid, or can either valid or invalid combinations. Projections may be further used in observing relations between variables defined as inputs and variables defined as outputs. The projections may be utilized in other similar manners. These analyses can be implemented using simple BDD operations such as existential and universal quantification, as is further disclosed hereinbelow.

In step 340, determination whether a coverage task is legal is performed. The determination may be performed by translating the values of the functional attributes to values of the BDD variables (with or without translating multi-valued domains to n-bits variables) and applying those values on the CCP BDD to determine whether the coverage task is within the Cartesian cross-product test-space (i.e., legal) or not (i.e., illegal). In some exemplary embodiments, determining whether a coverage tasks is legal may be useful in defining the functional coverage model, as the user 140 may want to verify the certain coverage tasks are legal or illegal under the defined functional coverage model.

In step 342, a projection of the functional model (e.g., functional coverage model, test planning model, or the like) may be determined. The projection may be with respect to a subset of the functional attributes. For example, in case that the functional model comprises 100 functional attributes, a subset of three functional attributes may be examined. The projection may indicate whether for a combination of values of the subset of functional attributes all coverage tasks are legal, all coverage tasks are illegal, or some of the coverage tasks are legal and some are illegal.

As an example, a projection to a tuple $T \subset FA$, where FA is the set of functional attributes may be determined.

In some exemplary embodiments, a projection of only those assignments for which all coverage tasks are legal may be determined. For each functional attribute, f, that is not in $T (f \notin T)$, universal quantification may be applied to determine a legal tuple set: $\forall f \notin T: \forall f$ FCM=1. The outcome of this operation may be determined by manipulating the CCP BDD, and the outcome may be provided as a BDD, referred to as the legal tuple BDD. The legal tuple BDD represents for an assignment to the tuple T whether all coverage tasks that comprise this assignment are legal.

In some exemplary embodiments, a projection of only those assignments for which all coverage tasks are illegal may be determined. For each functional attribute, f, that is not in $T (f \notin T)$, universal quantification may be applied to determine an illegal tuple set: $\forall f T \notin \forall f$ CCP=0. The outcome of this operation may be determined by manipulating the CCP BDD, and the outcome may be provided as a BDD, referred to as the illegal tuple BDD. The illegal tuple BDD represents for an assignment to the tuple T whether all coverage tasks that comprise this assignment are illegal.

In some exemplary embodiments, a projection of those assignments for which some coverage tasks are legal may be determined. For each functional attribute, f, that is not in $T(f \notin T)$, existential quantification may be applied to determine a partially legal tuple set: $\forall f \notin T: \exists f$ CCP=1. The outcome of this operation may be determined by manipulating the CCP BDD, and the outcome may be provided as a BDD, referred to as the partially legal tuple BDD. The partially legal tuple BDD represents for an assignment to the tuple T whether some coverage tasks that comprise this assignment are legal. In some exemplary embodiments, the outcome may be further conjuncted to provide for only those assignments to the tuple T where some coverage tasks that comprise the assignment are legal and some are illegal. The manipulation may be, for example: $\forall f \notin T: \exists f$ CCP=1 $\wedge \neg$ LT, where LT is the set of legal tuple. In other words, by conjuncting with the negation of the legal tuple BDD, the partially legal tuple BDD is ensured not to comprise any assignment for which all coverage tasks are legal.

It will be understood that other methods may be applied to determine a projection by manipulating the CCP BDD.

In step 345, filtering may be performed based on a Boolean criterion. The Boolean criteria may be encoded into a BDD, referred to as a filter BDD. The filter BDD may be conjuncted with the CCP BDD thereby filtering the Cartesian cross-product test-space in accordance with the Boolean criteria.

In step 350, a test plan for the Cartesian cross-product test-space may be determined.

Figure 3B:
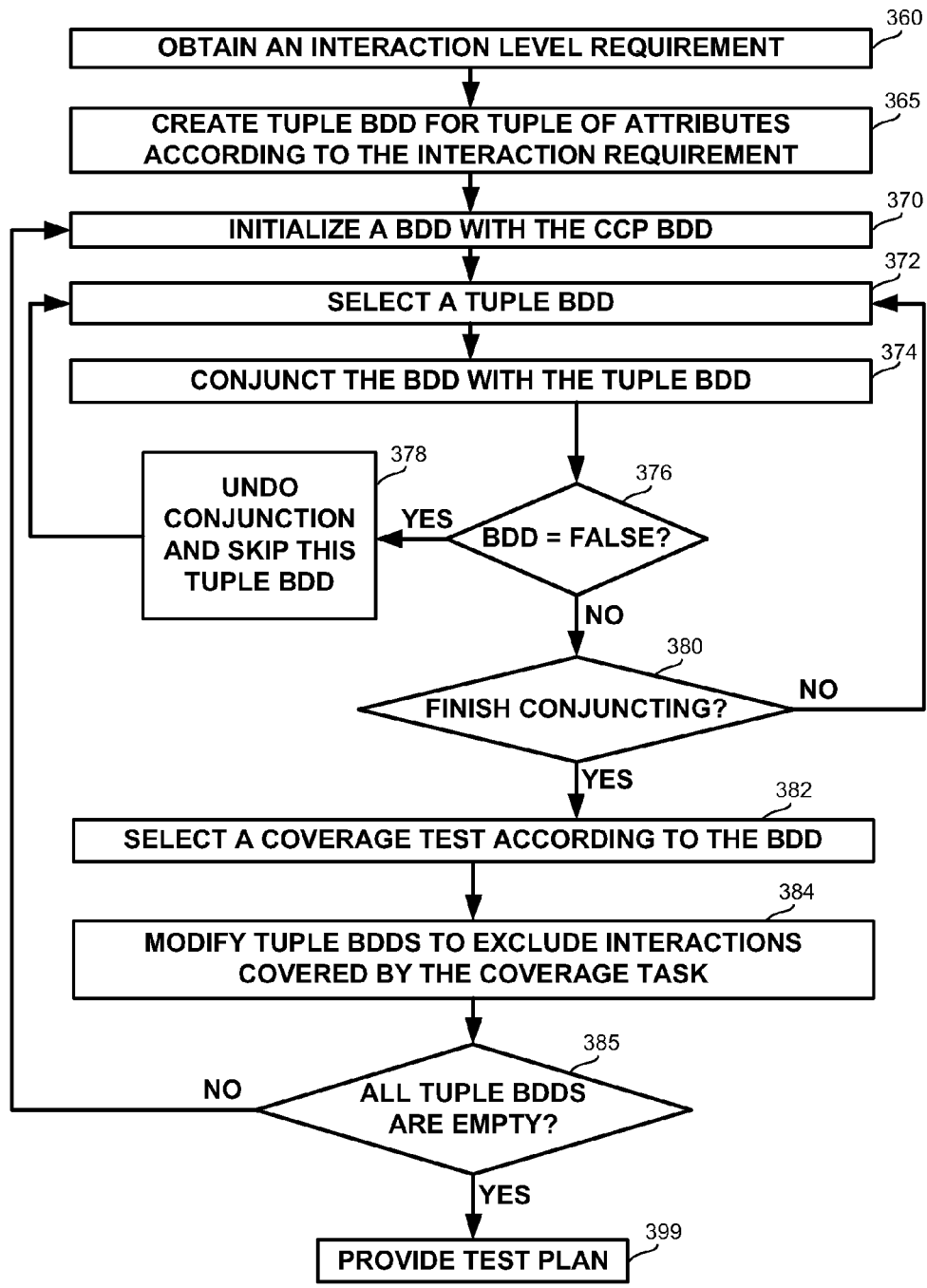
FIG. 3B shows a flowchart of a method of performing Combinatorial Test Design (CTD) using the BDD representing the Cartesian cross-product test-space, in accordance with some exemplary embodiments of the disclosed subject matter.

Referring now to FIG. 3B showing a flowchart of a method of performing CTD using the BDD representing the Cartesian cross-product test-space, in accordance with some exemplary embodiments of the disclosed subject matter.

In step 360, an interaction level requirement may be obtained.

In step 365, tuple BDDs may be created. Each tuple BDD is associated with a different tuple of functional attributes, where the tuple is the size of the required interaction level. The tuple is also referred to as an interaction tuple. For example, for an interaction level of 2 (pair-wise interaction requirement), for each pair of functional attributes a tuple BDD is created. The tuple BDD may indicate for each combination of values of the pair whether or not the pair may be seen in a legal coverage task. In some exemplary embodiments, the tuple BDD may be a partially legal BDD based on a projection to the tuple, such as comprising assignments to the tuple.

In steps 370-382 a coverage task may be determined. The determined coverage task is characterized in covering at least one interaction that was not yet covered by the previously determined test plan. The tuple BDDs comprises combinations of values of the tuple (i.e., interactions) that should be covered and were not yet covered by the previously determined test plan. Optimally, the determined coverage task covers one interaction with respect to each interaction tuple.

In step 370, a BDD may be initialized to hold the functional coverage test-space. In some exemplary embodiments, the BDD may be assigned the CCP BDD.

In step 372, a tuple BDD may be selected out of the plurality tuple BDDs. The selection may be performed heuristically. In some exemplary embodiments, a tuple BDD that is considered least restrictive may be selected (e.g., comprises most possible combinations of tuples for which the BDD is true), thereby enabling determining a coverage task that covers the most uncovered interactions. In some exemplary embodiments, skipped tuple BDDs may be skipped from the selection. The selection may be heuristically in accordance with previous conjunctions with the BDD and the portion of the BDD that was reduced by the conjunction. Other heuristics may be applied.

In step 374, the BDD may be conjuncted with the selected tuple BDD. Therefore, the outcome (which is stored in the BDD) is a portion of the functional coverage test-space which covers interactions in the selected tuple BDD.

In step 376, if the outcome BDD is false, no coverage task from the portion of test-space covers the interactions of the tuple BDD. As the tuple BDD comprises only interactions for which exists at least one coverage task, the BDD will be false only based on multiple conjunctions (e.g., conjuncting with a first tuple BDD and a second tuple BDD). If the BDD is false, the last conjunction may be undone and the last selected tuple BDD may be skipped to allow another tuple BDD to be selected (step 378). In some exemplary embodiments, after a plurality of tuple BDDs cause the BDD to be empty (i.e., evaluate to constant false), the conjunction may be stopped and step 382 may be performed. In some exemplary embodiments, the skipped tuple BDD may be utilized in another iteration after the BDD is initialized with the CCP BDD (in step 370).

In step 380, a determination whether to finish the conjunction is made. The conjunction may be finished after conjuncting all tuple BDDs, after either conjuncting or skipping all the tuple BDDs, or based on a heuristic determination. The heuristic determination may take into account the amount of resources used to compute and store the BDD. For example, if last computation took over a predetermined amount of time or memory, then it may be determined that no additional conjunction should be performed, as to avoid not being able to compute the conjuncted BDD (e.g., due to its expansion and/or complexity). In response to a determination to continue, step 372 is performed and another tuple BDD is selected.

In response to a determination to finish conjuncting, step 382 may be performed. A coverage task may be selected out of the BDD. The selected coverage task may be added to the test plan. In some exemplary embodiments, a plurality of coverage tasks are selected from the BDD, however, in some cases the coverage tasks may cover the same interactions.

In some exemplary embodiments, a coverage task may be selected by traversing a path of the BDD. Referring to BDD 200, a path ending in the terminal-1 node 240 may be used to select the coverage task. For example, the path comprising nodes 210, 225, 232, 240. In case the path does not comprise a value to all BDD variables, the BDD variable value may be selected randomly. For example, for the path comprising nodes 210, 222, 240 the value of $x_3$ may be selected randomly. In some exemplary embodiments, in case of a multi-valued domain, the value selection may be performed so as to ensure that the value of the n-bits is associated with a value of the functional attribute. In some exemplary embodiments, based on the values of the BDD variables, the values of the functional attributes are determined and the coverage task is determined.

Additionally or alternatively, in some cases, the user 140 may determine a desired distribution of the test plan. For example, consider functional attribute indicative of the operating system. Assuming the user 140 has, at his disposal, a plurality of computers, 80% of them operating using Microsoft® Windows® and 20% of them operating using Linux™, the user 140 may determine that the test plan should be distributed in a 4:1 ratio between these two values, so as to enable a more efficient execution of the test plan, without substantial idle time of the computers. Based on such distribution, the coverage task may be selected. For example, in case the current ratio of values in the previously determined test plan is 1:1, the next selection may be biased towards Windows as the operating system, while if the current ratio is 8:1, the selection process may be biased towards selecting Linux. Biasing the random selection may be performed by determining a probability for selecting a value of each BDD variable, and performing the random traversal of the BDD based on the probabilities.

In step 384, the tuple BDDs may be modified to exclude interactions that were covered by the determined coverage task. Thereby, ensuring that next time the tuple BDD is conjuncted the same interaction is not covered. In some exemplary embodiments, the following manipulation may be performed: $\forall \text{tupleBDD}: \text{tupleBDD} = \text{tupleBDD} \land \neg (\text{task} \land \text{tupleBDD})$, wherein tupleBDD is the tuple BDD and task is the determined coverage task.

In step 385, in case all tuple BDDs are empty (i.e., all tuple BDDs are evaluated to the constant zero (false)), then all interactions required by the interaction level requirement of step 360 may be considered as covered by the test plan. The test plan may be provided in step 399. In case at least one tuple BDD is not empty, steps 370-285 are performed again to cover additional interactions.

In some exemplary embodiments, steps 370-385 are performed iteratively to provide for additional coverage tasks to the test plan that cover previously uncovered interactions. In some exemplary embodiments, other methods of manipulating the BDDs may be utilized to determine the test plan in accordance with CTD.

It will be noted, that other method of determining the test plan according to CTD may be performed. For example, conjuncting with a predetermined number of tuple BDDs (e.g., one tuple BDD) may ensure that at least one new interaction is always covered.

Figure 4:
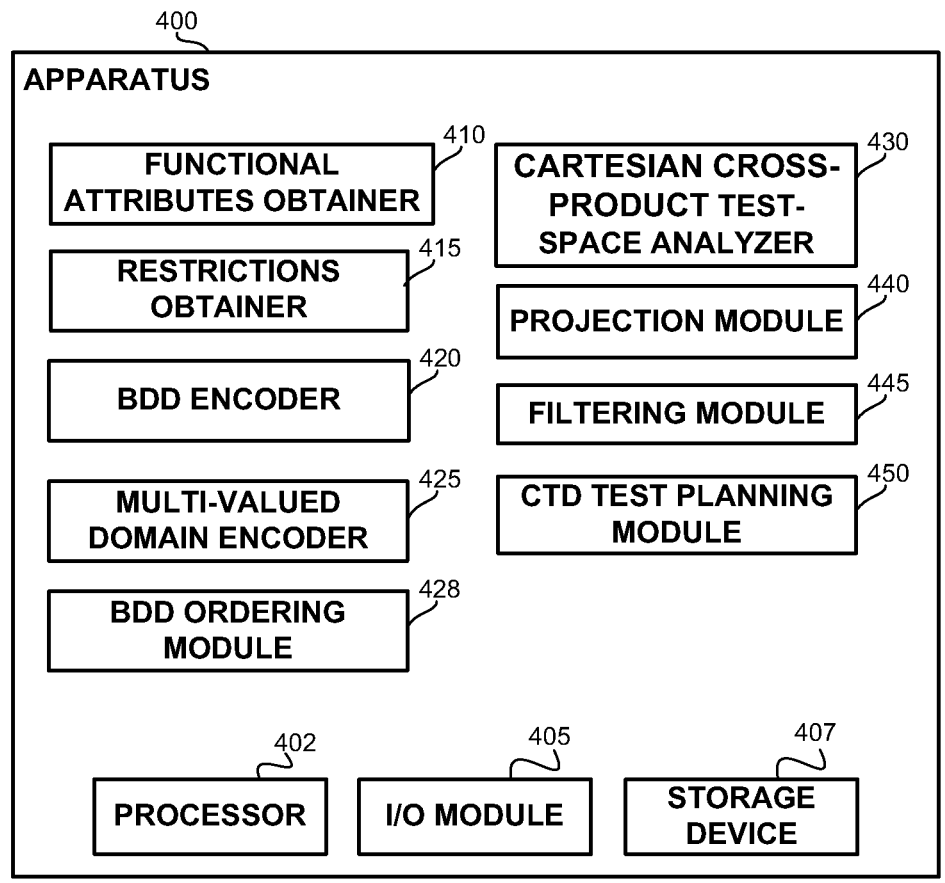
FIG. 4 shows a block diagram of components of an apparatus, in accordance with some exemplary embodiments of the disclosed subject matter.

Referring now to FIG. 4 showing a block diagram of components of an apparatus, in accordance with some exemplary embodiments of the disclosed subject matter. Apparatus 400 may be configured to represent a functional coverage test-space is using a symbolic representation, such as a BDD. The apparatus 400 may be configured to perform methods such as disclosed in FIG. 3A and FIG. 3B. The apparatus 400 may provide the functionalities of the functional coverage model defining tool 110, the functional coverage analysis tool 120, the test planning tool 130 or the like.

A functional attributes obtainer 410 may be configured to obtain the functional attributes and define for each attribute a domain, such as based on a user selection or definition.

A restrictions obtainer 415 may be configured to obtain one or more restrictions over the Cartesian product of the functional attributes.

A BDD encoder 420 may be configured to encode the Cartesian cross-product test-space using a BDD. The BDD encoder may encode the BDD in a similar manner to that described with respect to steps 315, 325 and 330 of FIG. 3A.

A multi-valued domain encoder 425 may be configured to encode multi-valued domains using n-bits. The multi-valued domain encoder 425 may perform steps 305, 310 of FIG. 3A.

A BDD ordering module 428 may be configured to determine an ordering of the BDD variables, such as disclosed with respect to step 318 of FIG. 3A.

A Cartesian cross-product test-space analyzer 430 may be configured to assist in analysis in defining the Cartesian cross-product test-space and/or in determining a test plan based on the test-space. The Cartesian cross-product test-space analyzer 430 may be configured to provide functionalities such as described with respect to steps 335-350 of FIG. 3A.

A projection module 440 may provide a projection of the coverage test-space to a subset of functional attributes. The projection module 440 may provide functionalities such as descried with respect to step 345.

A filtering module 445 may be configured to filter the test-space based on a Boolean criterion. The filtering module 445 may provide functionalities such as described with respect to step 345.

A test planning module may be configured to determine a test plan. In some exemplary embodiments the test planning module may be a CTD test planning module 450 configured to determine a test plan in accordance with CTD. The test plan may be designed to cover all interactions of a predetermined number of functional attributes, such as two, three, four, or the like. In some exemplary embodiments, the CTD test planning module 450 may be configured to obtain an interaction requirement. The CTD test planning module 450 may provide functionalities such as described with respect to step 350 of FIG. 3A and FIG. 3B.

In some exemplary embodiments, the apparatus 400 may comprise a processor 402. The processor 402 may be a Central Processing Unit (CPU), a microprocessor, an electronic circuit, an Integrated Circuit (IC) or the like. The processor 402 may be utilized to perform computations required by the apparatus 400 or any of it subcomponents.

In some exemplary embodiments of the disclosed subject matter, the apparatus 400 may comprise an Input/Output (I/O) module 405. The I/O module 405 may be utilized to provide an output to and receive input from the user 140. The I/O module 405 may provide for an interface to external modules, tools, devices, or the like. The I/O module 405 may be utilized to obtain information from the user, such as for the functional attributes obtainer 410, restrictions obtainer 415. The I/O module 405 may obtain from a user a command to perform a projection, to Boolean criterion to be used to filter the test-space, a coverage task to examine, an interaction level or the like. In some exemplary embodiments, the I/O module 405 may provide an output to the user 140 such as the test plan, the output of a requested manipulation or the like. In some exemplary embodiments, the I/O module 405 may be configured to provide the dynamic verification tool 115 with the test plan to be performed.

In some exemplary embodiments, the apparatus 400 may comprise a storage device 407. The storage device 407 may be a hard disk drive, a Flash disk, a Random Access Memory (RAM), a memory chip, or the like. In some exemplary embodiments, the storage device 407 may retain program code operative to cause the processor 402 to perform acts associated with any of the subcomponents of the apparatus 400. In some exemplary embodiments, the storage device 402 may retain the BDDs utilized by the apparatus.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", an and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
    obtaining a set of functional attributes and domains with respect to a System Under Test (SUT), wherein each domain is associated with a functional attribute;
    obtaining a set of restrictions that restrict combinations of values of the functional attributes;
    encoding, by a computer on a non-transitory computer-readable medium, a Binary Decision Diagram (BDD) to represent a Cartesian cross-product test-space of all possible combinations of values of the functional attributes excluding combinations that are restricted by the set of restrictions, whereby the BDD symbolically represents the Cartesian cross-product test-space; and
    analyzing, by the computer, the Cartesian cross-product test-space by manipulating the BDD so as to assist in performing verification of the SUT.

2. The computer-implemented method of claim 1, wherein said encoding the BDD comprises:
    initializing the BDD with a constant true value; and
    for substantially each restriction:
        building an additional BDD representing the restriction; and
        conjuncting between the BDD and a negation of the additional BDD.

3. The computer-implemented method of claim 1, wherein said encoding comprises:
    identifying a domain having more than two possible values;
    based on the number of values in the domain, determining a number of bits for encoding the domain; and
    encoding each value of the domain into a binary value having the number of bits.

4. The computer-implemented method of claim 1, wherein said encoding further comprises:
    identifying a complementing set of binary values having the number of bits which do not correspond to any value of the domain;
    with respect to manipulation of the BDD, ignoring the complementing set of binary values, so as to avoid having the complementing set of binary values to have effect on an outcome of the BDD manipulation.

5. The computer-implemented method of claim 1, wherein said analyzing comprises determining whether a coverage task, having values, is a legal coverage task by checking whether the BDD for the values of the coverage task returns a true value.

6. The computer-implemented method of claim 1, wherein said analyzing comprises providing a user defining the Cartesian cross-product test-space with a projection of the BDD to a subset of attributes, the projection indicative of whether for a combination of values to the subset of attributes all possible coverage tasks are legal, all possible coverage tasks are illegal or there exists both legal and illegal coverage tasks.

7. The computer-implemented method of claim 6, wherein said providing comprises:
    computing a legal tuples BDD by performing at least universal quantification on the BDD, wherein the legal tuples BDD comprises all tuples for which all coverage tasks are legal;
    computing an illegal tuples BDD by performing at least universal quantification on the BDD, wherein the illegal tuples BDD comprises all tuples for which all coverage tasks are illegal; and
    computing a partially legal tuples BDD by performing at least existential quantification on the BDD, wherein the partially legal tuples BDD comprises all tuples for which there exists both legal and illegal coverage tasks.

8. The computer-implemented method of claim 1, wherein said analyzing comprises performing test planning for the Cartesian cross-product test-space so as to determine requirements of tests to be performed on the SUT.

9. The computer-implemented method of claim 8, wherein the test planning is a Combinatorial Test Design (CTD), wherein the CTD determines a set of coverage tasks to be performed, the set of coverage tasks is characterized in that a predetermined level of interaction between the functional attributes is achieved by performing the set of coverage tasks.

10. The computer-implemented method of claim 9, wherein the CTD comprises:
    having a predetermined interaction level of n functional attributes;
    determining a tuple BDD for each tuple comprising n functional attributes, wherein each tuple BDD represents a conjunction of all possible combination of values with respect to the tuple; and
    iteratively conjuncting the BDD with at least a portion of the tuple BDDs to determine a coverage task and removing from the tuple BDDs the combination of values of the coverage task.

11. The computer-implemented method of claim 10, wherein said iteratively conjuncting and removing comprises: iteratively conjuncting tuple BDDs with the BDD in a descending order of the number of combinations the tuple BDD represents and heuristically determining whether to continue with additional tuple BDDs based on the size of the outcome BDD.

12. The computer-implemented method of claim 10, wherein said iteratively conjuncting and removing comprises: iteratively conjuncting tuple BDDs with the BDD and in response to the outcome BDD being evaluated to a constant false, undoing a previous conjuncting with a tuple BDD and skipping conjuncting the tuple BDD by conjuncting with another tuple BDD instead.

13. The computer-implemented method of claim 1, further comprises defining a static order of the functional attributes, the static order is based on a number of times each functional attribute appears in the restrictions.

14. A computerized apparatus having a processor, the apparatus comprising:
  a functional attributes obtainer adapted to obtain a set of functional attributes and domains with respect to a System Under Test (SUT), wherein each domain is associated with a functional attribute;
  a restrictions obtainer adapted to obtain a set of restrictions that restrict combinations of values of the functional attributes;
  a Binary Decision Diagram (BDD) encoder, implemented by a processor, adapted to encode in a non-transitory computer-readable medium a BDD to represent a Cartesian cross-product test-space of all possible combinations of values of the functional attributes excluding combinations that are restricted by the set of restrictions, the BDD symbolically represents the Cartesian cross-product test-space; and
  a Cartesian cross-product test-space analyzer, implemented by a processor, configured to analyze the Cartesian cross-product test-space by manipulating the BDD so as to assist in performing verification of the SUT.

15. The computerized apparatus of claim 14, wherein said BDD encoder is configured to encode the BDD by initializing the BDD with a constant true value and by conjuncting restriction BDDs with the BDD, wherein said BDD encoder is further configured to build the restriction BDDs based on the restrictions.

16. The computerized apparatus of claim 14, further comprising a multi-valued domain encoding module, wherein said multi-valued domain encoding module is configured to encode domains having more than two possible values using a binary value of two or more bits, and wherein said multi-valued domain encoding is operative to filter-out any effect on an outcome of BDD operations by a binary value that is not associated with any value in the domain.

17. The computerized apparatus of claim 14, wherein said Cartesian cross-product test-space analyzer is operatively coupled to a projection module, wherein the projection module is operative to determine a projection of the BDD to a subset of attributes, the projection indicative of whether for a combination of values to the subset of attributes all possible coverage tasks are legal, all possible coverage tasks are illegal or there exists both legal and illegal coverage tasks.

18. The computerized apparatus of claim 17, wherein said projection module is operative to perform universal quantification of a functional attribute not within the subset of functional attribute on the BDD to provide a tuple BDD indicative of whether coverage tasks comprising values of the subset are legal, illegal or combination thereof.

19. The computerized apparatus of claim 14, wherein said Cartesian cross-product test-space analyzer is operatively coupled to a test planning module, wherein said test planning module is configured to determine requirements of tests to be performed on the SUT in order to provide sufficient coverage of the Cartesian cross-product test-space.

20. The computerized apparatus of claim 19, wherein said test planning module is a Combinatorial Test Design (CTD) module, wherein said CTD module is configured to determine a set of coverage tests to be performed so as to provide coverage of at least a predetermined interaction level between the functional attributes.

21. The computerized apparatus of claim 20, wherein said CTD module is configured to:
  obtaining an interaction level of n functional attributes;
  determine a tuple BDD for each tuple comprising exactly n functional attributes, wherein each tuple BDD represents a conjunction of all possible combination of values with respect to the tuple; and
  iteratively conjunct the BDD with at least a portion of the tuple BDDs to determine a coverage task and removing from the tuple BDDs the combination of values of the coverage task.

22. The computerized apparatus of claim 14, further comprises a BDD ordering module operative to provide for a static order of the functional attributes in the BDD, wherein the static order is based on a number of times each functional attribute appears in the restrictions.

23. The computerized apparatus of claim 14, wherein the Cartesian cross-product test-space is selected from the group consisting of a functional coverage test-space and a planning test-space.

24. A computer program product comprising a non-transitory computer readable medium retaining program instructions, which instructions when read by a processor, cause the processor to perform a method comprising:
  obtaining a set of functional attributes and domains with respect to a System Under Test (SUT), wherein each domain is associated with a functional attribute;
  obtaining a set of restrictions that restrict combinations of values of the functional attributes;
  encoding, by a computer on a second non-transitory computer-readable medium, a Binary Decision Diagram (BDD) to represent a Cartesian cross-product test-space of all possible combinations of values of the functional attributes excluding combinations that are restricted by the set of restrictions, whereby the BDD symbolically represents the Cartesian cross-product test-space; and
  analyzing, by the computer, the Cartesian cross-product test-space by manipulating the BDD so as to assist in performing verification of the SUT.

* * * * *